United States Patent
Yoshida et al.

(10) Patent No.: US 9,841,442 B2
(45) Date of Patent: Dec. 12, 2017

(54) CURRENT DETECTING DEVICE

(71) Applicant: Panasonic Intellectual Property Management Co., Ltd., Osaka (JP)

(72) Inventors: Hiroshi Yoshida, Osaka (JP); Masataka Kanda, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 188 days.

(21) Appl. No.: 14/441,719

(22) PCT Filed: Nov. 18, 2013

(86) PCT No.: PCT/JP2013/006758
§ 371 (c)(1),
(2) Date: May 8, 2015

(87) PCT Pub. No.: WO2014/080609
PCT Pub. Date: May 30, 2014

(65) Prior Publication Data
US 2015/0276816 A1    Oct. 1, 2015

(30) Foreign Application Priority Data

Nov. 21, 2012  (JP) ................. 2012-255577
Oct. 15, 2013  (JP) ................. 2013-214810

(51) Int. Cl.
*G01R 35/00*  (2006.01)
*G06F 3/038*  (2013.01)
(Continued)

(52) U.S. Cl.
CPC ....... *G01R 15/185* (2013.01); *G01R 19/0092* (2013.01); *G01R 19/165* (2013.01); *G01R 19/20* (2013.01)

(58) Field of Classification Search
CPC .......................... G01R 15/185; G01R 19/165; G01R 19/0092; G01R 19/20
(Continued)

(56) References Cited

U.S. PATENT DOCUMENTS 4,286,211 A      8/1981  Nakamura et al.
6,456,059 B1 *   9/2002  Blakely ................ G01R 15/183
                                                       324/117 H
(Continued)

FOREIGN PATENT DOCUMENTS

FR    2 744 529 A1    8/1997
JP    64-003568 A     1/1989
(Continued)

OTHER PUBLICATIONS

Extended European Search Report issued in Application No. 13857221.9 dated Dec. 4, 2015.
(Continued)

*Primary Examiner* — Farhana Hoque
(74) *Attorney, Agent, or Firm* — McDermott Will & Emery LLP

(57) ABSTRACT

A first coil is wound around a first core, and have one end that is connected to ground and the other end that is connected to one end of a second coil. The second coil is wound around a second core, and has the one end that is connected to the first coil, and the other end that is connected to an excitation unit via a current-limiting resistor. A magnetic flux is generated in the first core by an excitation signal outputted from the excitation unit. Induced electromotive force is generated in the conductor due to the magnetic flux generated in the first core. The direction of the magnetic flux generated in the second core is opposite to the direction of the magnetic flux generated in the first core, and the induced electromotive forces of them generated in the conductor are cancelled each other out.

19 Claims, 15 Drawing Sheets

(51) Int. Cl.
*G01R 15/18* (2006.01)
*G01R 19/00* (2006.01)
*G01R 19/165* (2006.01)
*G01R 19/20* (2006.01)

(58) Field of Classification Search
USPC .............................. 324/202, 244; 345/212
See application file for complete search history.

(56) References Cited

U.S. PATENT DOCUMENTS

| | | | |
|---|---|---|---|
| 2008/0054898 A1* | 3/2008 | Hausperger | G01R 15/185 324/260 |
| 2008/0056690 A1* | 3/2008 | Fujishiro | B60L 11/123 388/820 |
| 2011/0006753 A1 | 1/2011 | Yu et al. | |
| 2014/0239946 A1 | 8/2014 | Suzuki | |

FOREIGN PATENT DOCUMENTS

| | | |
|---|---|---|
| JP | 10-332745 A | 12/1998 |
| JP | 11-002647 A | 1/1999 |
| JP | 2007-033222 A | 2/2007 |
| JP | 2007-316042 A | 12/2007 |
| JP | 2008-519269 A | 6/2008 |
| JP | 2011017618 A | 1/2011 |
| WO | 2006/048020 A1 | 5/2006 |
| WO | 2013/088766 A1 | 6/2013 |

OTHER PUBLICATIONS

International Search Report issued in International Application No. PCT/JP2013/006758 dated Dec. 24, 2013, with English translation.

* cited by examiner

FIG. 12A
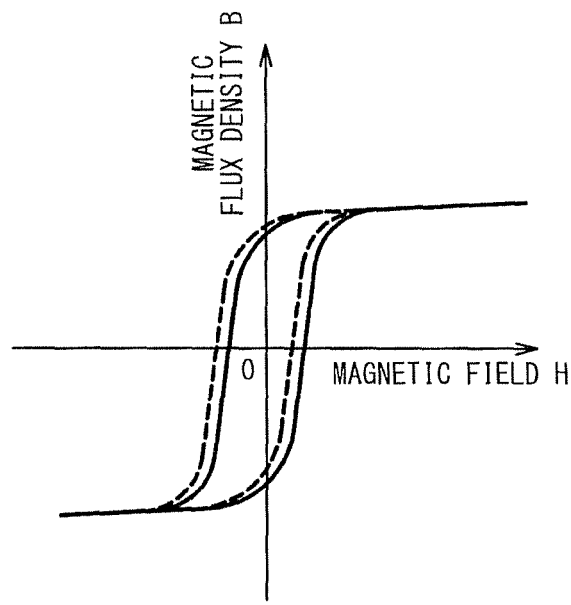
FIG. 12B
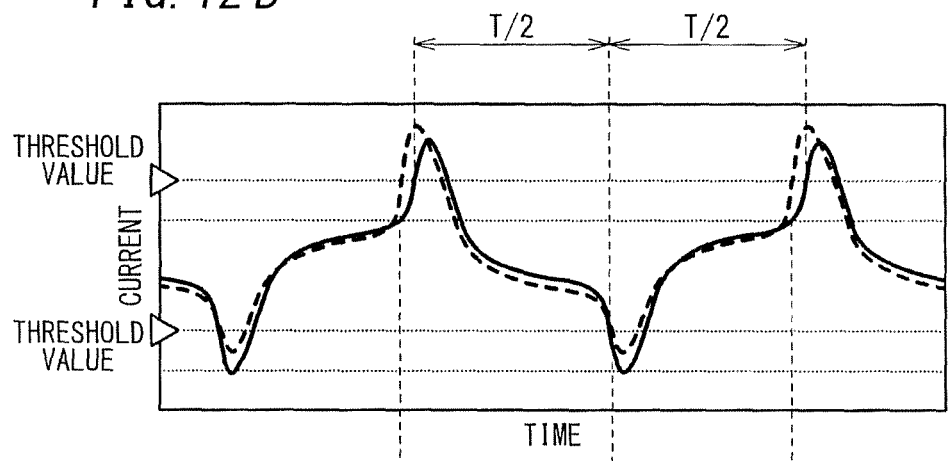
FIG. 12C
FIG. 12D
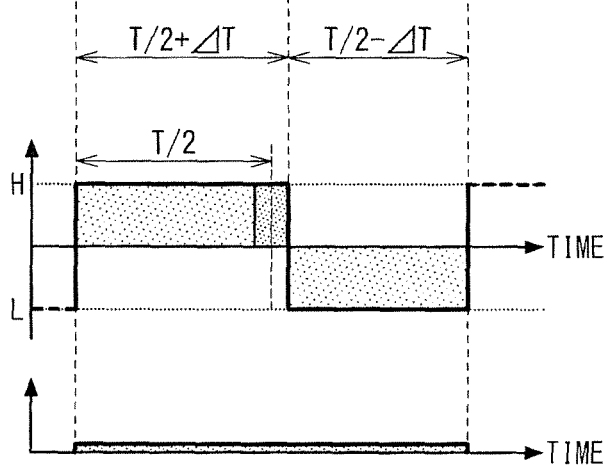

CURRENT DETECTING DEVICE

RELATED APPLICATIONS

This application is the U.S. National Phase under 35 U.S.C. §371 of International Application No. PCT/JP2013/006758, filed on Nov. 18, 2013, which in turn claims the benefit of Japanese Application No. 2012-255577, filed on Nov. 21, 2012, and Japanese Application No. 2013-214810, filed Oct. 15, 2013, the disclosures of which are incorporated by reference herein.

TECHNICAL FIELD

The present invention relates to a current detecting device configured to detect current flowing in a conductor in a contactless manner.

BACKGROUND ART

Current detecting devices of this type include a current detecting device described in JP 2007-33222A (hereinafter referred to as Document 1), for example. The conventional example described in Document 1 includes a core (closed magnetic circuit core) shaped like a circular ring into which a conductor is inserted, a coil (winding) wound around the core, and an AC power supply configured to apply an AC excitation voltage to the coil. Furthermore, in the conventional example described in Document 1, the current flowing through the coil is converted to a voltage signal by a detection resistor, peak values of the voltage signal are held by positive and negative peak hold circuits, and a voltage resulting from combining the outputs of the two peak hold circuits is added to the AC excitation voltage to thereby be fed back to the coil.

That is to say, when a magnetic flux is generated on the periphery of the conductor by a current flowing in the conductor that passes through the core, a feedback voltage resulting from combining the outputs of the positive and negative peak hold circuits becomes asymmetric in positive and negative polarities. By applying the feedback voltage to the coil a magnetic flux having a direction and strength that cancels the above-mentioned magnetic flux is generated. Therefore, the magnitude of the current flowing in the conductor can be measured by measuring the feedback voltage with the detection resistor.

Incidentally, the conductor, in which the detection target current flows, generally forms a closed circuit. Accordingly, a transformer is to be formed by the conductor that forms the closed circuit and one coil that is wound around one core, and accordingly an induced current is to flow in the conductor. As a result, there is a problem with the conventional example described in Document 1 in that noise (noise terminal voltage) is superimposed in the closed circuit that includes the conductor, when the AC excitation voltage is applied to the coil.

SUMMARY OF INVENTION

The present invention has been made in view of the above-described problems, and an object of the present invention is to suppress noise that is superimposed in a conductor.

The current detecting device according to the present invention includes: a first core around which a first coil is wound, and to be disposed in a vicinity of a conductor which is a detection target; a second core around which a second coil is wound, and to be disposed in a vicinity of the conductor; an excitation unit configured to apply an excitation signal, having a magnitude and a direction that change at a given frequency, to the first coil and the second coil; and a feedback unit configured to feedback a feedback signal to the excitation signal such that a magnetic flux generated in the first core due to current flowing in the conductor is cancelled out. The second coil is configured to generate a magnetic flux having a direction opposite to a magnetic flux generated by the excitation signal flowing in the first coil.

It is preferable that, in the current detecting device, the first coil and the second coil are connected in series to the excitation unit.

It is preferable that, in the current detecting device, the first coil and the second coil are connected in parallel to the excitation unit.

It is preferable that the current detecting device further includes a third coil that is wound around both the first core and the second core, and forms a closed circuit.

It is preferable that the current detecting device further includes a third core to be disposed in a vicinity of the conductor, and the third coil is also wound around the third core.

It is preferable that the current detecting device further includes a shield case made of magnetic material and housing the first core and the second core along with the first coil and the second coil.

It is preferable that, in the current detecting device, an impedance element or a low pass filter is located in a path in which the excitation signal flows from the excitation unit to the first coil and the second coil.

It is preferable that, in the current detecting device, the excitation unit is configured to shape a signal waveform of the excitation signal to a sine wave, a triangular wave, or a trapezoidal wave.

It is preferable that, in the current detecting device, the excitation unit is configured to shape a signal waveform of the excitation signal to a square wave.

It is preferable that the current detecting device further includes a signal voltage measurement unit configured to measure a signal voltage of the excitation signal that is applied to the first coil and the second coil.

It is preferable that the current detecting device further includes a signal current measurement unit configured to measure a signal current of the excitation signal that flows in the first coil and the second coil.

It is preferable that the current detecting device further includes a comparison unit configured to compare a measured value of the signal voltage or the signal current with a predetermined threshold value.

It is preferable that the current detecting device further includes a frequency extraction unit configured to extract a frequency corresponding to twice the given frequency from the excitation signal, and the feedback unit is configured to generate the feedback signal based on the frequency extracted by the frequency extraction unit.

It is preferable that, in the current detecting device, the feedback unit is configured to output the excitation signal having a waveform which is symmetric in positive and negative, the current detecting device further includes a peak hold unit configured to hold positive and negative peak values of the excitation signal, and the feedback unit is configured to generate the feedback signal from the positive and negative peak values that are held in the peak hold unit.

It is preferable that, in the current detecting device, the feedback unit includes a comparator configured to compare the excitation signal with threshold values that have the same absolute value and different signs, and is configured to generate the feedback signal from an output of the comparator.

It is preferable that, in the current detecting device, the feedback unit includes a non-inverting amplifier configured to perform non-inverting amplification on the feedback signal, and an inverting amplifier configured to perform inverting amplification on the feedback signal, and output terminals of the non-inverting amplifier and the inverting amplifier are bridge-connected to the first coil and the second coil.

It is preferable that, in the current detecting device, the feedback unit includes a first adder configured to add the feedback signal to the excitation signal and cause the added signal to flow to the first coil, and a second adder configured to add a signal generated by inverting the feedback signal to the excitation signal and cause the added signal to flow to the second coil.

It is preferable that the current detecting device further includes a detection resistor for detecting a signal voltage of the feedback signal, and a low pass filter provided upstream of the detection resistor.

In the current detecting device according to the present invention, the second core that generates a magnetic flux having a direction opposite to the magnetic flux generated in the first core is disposed in the vicinity of the conductor along with the first core, and thus the induced electromotive force induced in the conductor due to the magnetic flux generated in the first core and the induced electromotive force induced in the conductor due to the magnetic flux generated in the second core are cancelled with each other. Accordingly, the current detecting device has an effect that noise that is superimposed in the conductor can be suppressed.

BRIEF DESCRIPTION OF DRAWINGS

FIGS. 12A to 12D are waveform diagrams for describing operations of Embodiment 3;

DESCRIPTION OF EMBODIMENTS

Hereinafter, embodiments of current detecting devices according to the present invention will be described in detail with reference to the drawings.

Embodiment 1

Figure 1:
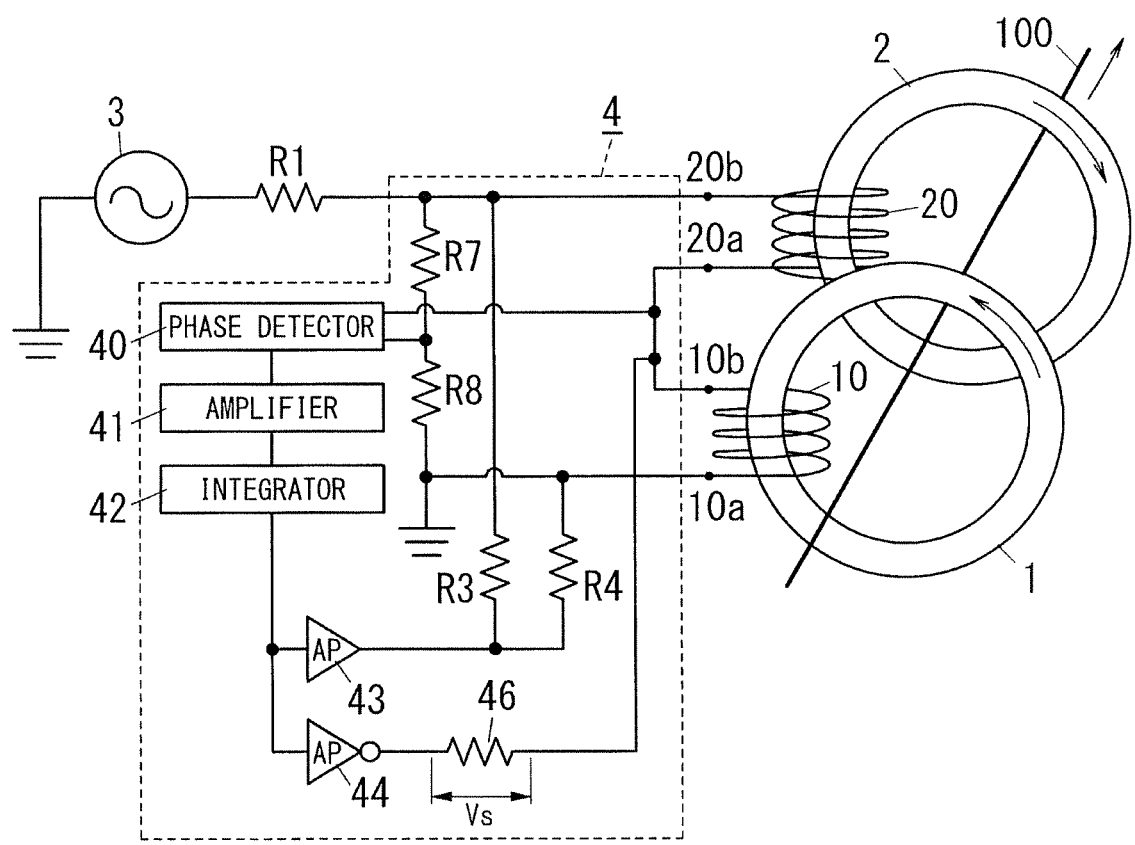
FIG. 1 is a block diagram illustrating Embodiment 1 of a current detecting device according to the present invention.

The present embodiment includes, as shown in FIG. 1, a first core 1 around which a first coil 10 is wound, a second core 2 around which a second coil 20 is wound, an excitation unit 3, a feedback unit 4, and the like.

The first core 1 and the second core 2 are disposed in the vicinity of a conductor 100 as a detection target. Note that the vicinity of the conductor 100 refers to a position at which a magnetic flux having a detectable magnitude is generated in the first core 1 (second core) when current flows in the conductor 100. In the present embodiment, the first core 1 and the second core 2 are formed of a soft magnetic material in a circular ring shape through which the conductor 100, which is a detection target, passes. The soft magnetic material that forms the cores 1 and 2 is preferably a nanocrystal material, an amorphous metal material (such as amorphous ribbon or amorphous wire), ferrite, a magnetic fluid, or the like. Note that the nanocrystal material and the amorphous metal material have an advantage that a hysteresis loop is maintained up to a high frequency, and the amorphous metal material is superior in strength over the nanocrystal material. Also, ferrite has a feature of the cost being lower than the nanocrystal material and the amorphous metal material, and the magnetic fluid has a feature of not having hysteresis.

The first coil 10 is wound around the first core 1, and one end (first end 10a) thereof is connected to ground and the other end (second end 10b) thereof is connected to one end (first end 20a) of the second coil 20. The second coil 20 is wound around the second core 2, and one end (first end 20a) thereof is connected to the first coil 10 and the other end (second end 20b) thereof is connected to an excitation unit 3 via a current-limiting resistor R1. Note that the second coil 20 is wound in the direction opposite to that of the first coil 10.

Figure 3:
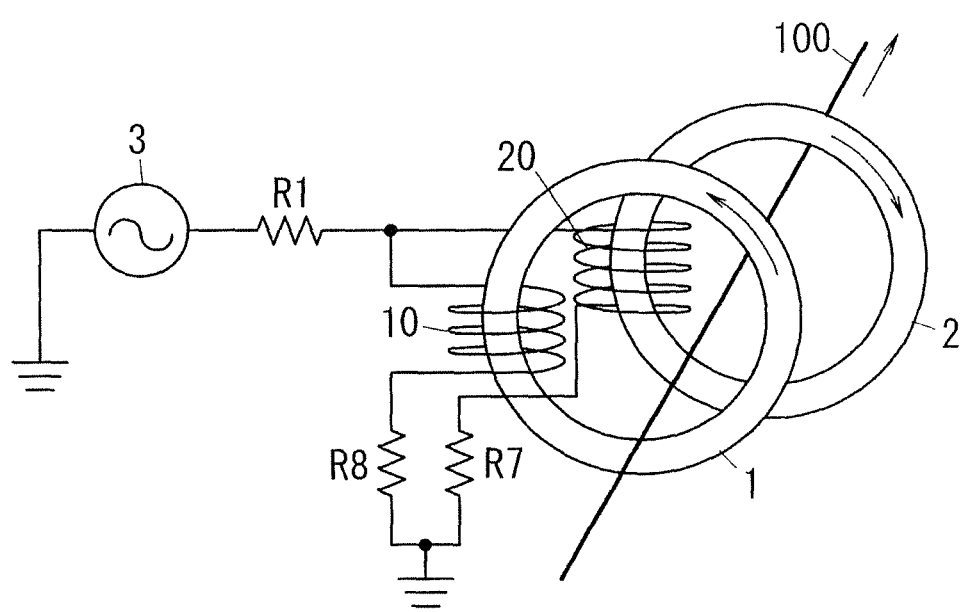
FIG. 3 is a block diagram illustrating a variation of Embodiment 1 in which a portion thereof has been omitted.

The excitation unit 3 is configured to output an excitation signal having a waveform in which the magnitude and direction change at a constant period and which is symmetric in positive and negative polarities (such as sine wave, square wave, triangular wave, or trapezoidal wave; refer to FIGS. 15A to 15D). A positive electrode of the excitation unit 3 is connected to the second end 20b of the second coil 20 via the current limiting resistor R1, and a negative electrode of the excitation unit 3 is grounded. In the embodiment therefore, the first coil 10 and the second coil 20 are connected in series to the excitation unit 3. Note that, as shown in FIG. 3, the first coil 10 and the second coil 20 may be connected in parallel to the excitation unit 3.

Figure 2:
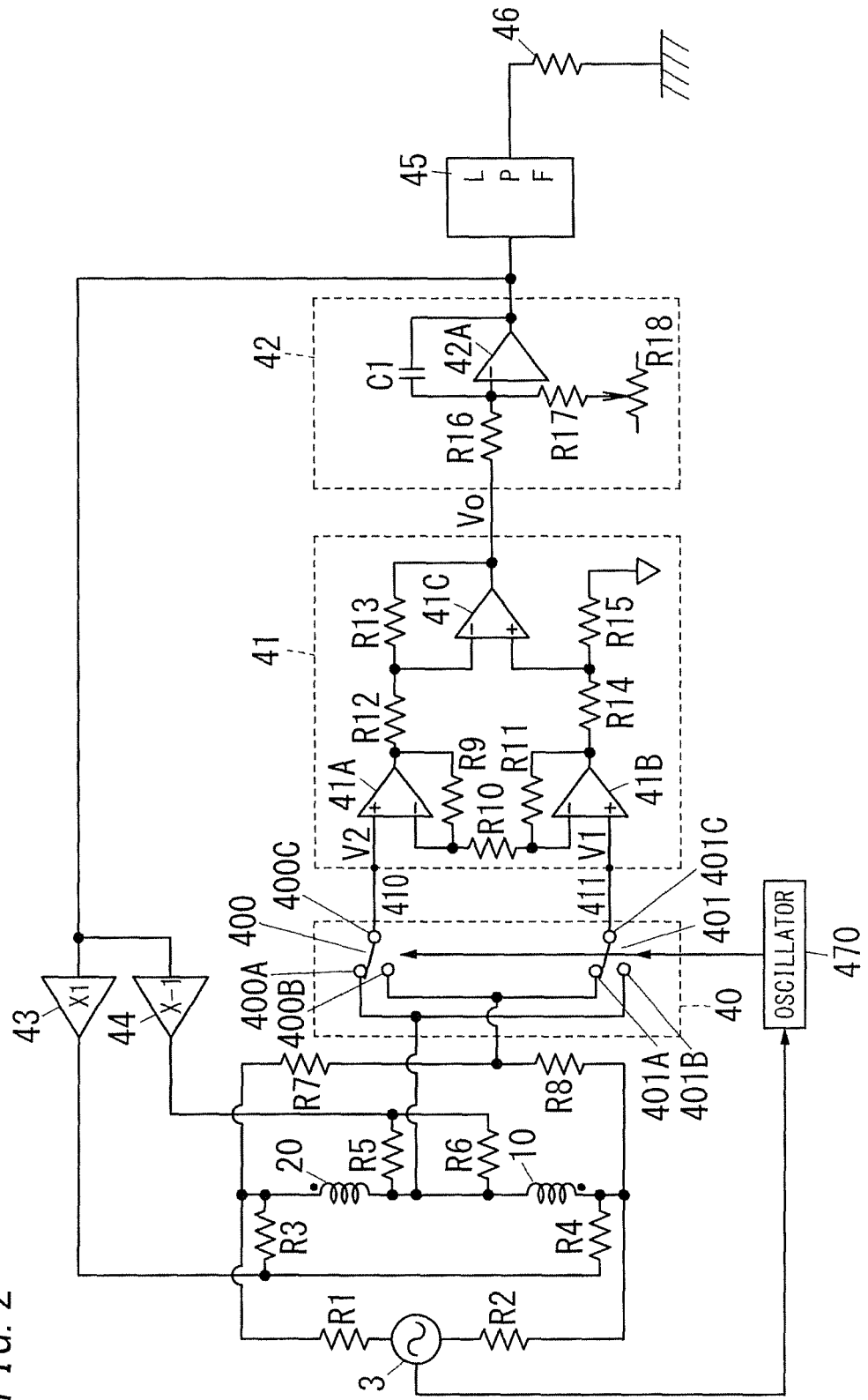
FIG. 2 is a circuit configuration diagram of Embodiment 1.

The feedback unit 4 is configured to generate a feedback signal for cancelling the magnetic flux generated in the first core 1 due to current flowing in the conductor 100, and superimpose (feed back) the generated feedback signal on the excitation signal. As shown in FIG. 1, the feedback unit 4 includes a phase detector 40, an amplifier 41, an integrator 42, a non-inverting amplifier 43, an inverting amplifier 44, a detection resistor 46, and the like. Here, a specific circuit configuration of the feedback unit 4 is shown in FIG. 2. Note that, in the circuit configuration in FIG. 2, a low pass filter (LPF) 45 is added to the circuit configuration in FIG. 1, and a detection resistor 46 is connected between the low pass filter 45 and ground.

As shown in FIG. 2, the phase detector 40 includes a first change-over switch 400 having a pair of change-over contacts 400A and 400B, and a second change-over switch 401 having a pair of change-over contacts 401A and 401B. In the change-over switches 400 and 401, the change-over contacts 400B and 401A on one side are connected to a connection point (voltage-dividing point) of voltage-dividing resistors R7 and R8 that is connected in parallel to a series circuit of the first coil 10 and the second coil 20. The change-over contacts 400A and 401B on the other side are connected to a connection point of the two coils 10 and 20. That is, the first change-over switch 400 includes the first change-over contact 400B and the second change-over contact 400A, and the second change-over switch 401 includes the first change-over contact 401A and the second change-over contact 401B. The first change-over contacts 400B and 401A are connected to the connection point of the voltage-dividing resistors R7 and R8, and the second change-over contacts 400A and 401B are connected to the connection point of the first coil 10 and the second coil 20. Also, a common contact 400C of one change-over switch (first change-over switch) 400 is connected to one input terminal (first input terminal 410) of the amplifier 41. Furthermore, a common contact 401C of the other change-over switch (second change-over switch) 401 is connected to the other input terminal (second input terminal 411) of the amplifier 41.

The feedback unit 4 includes an oscillator 470 configured to output a switching signal (square pulse) having a predetermined frequency. The first and second change-over switches 400 and 401 are switched to be in contact with the one side-change-over contacts 400A and 401A at a rising edge of the square pulse that is outputted from the oscillator 470, and are switched to be in contact with the other side-change-over contacts 400B and 401B at a falling edge of the square pulse. That is, the phase detector 40 (first and second change-over switches 400 and 401) is switched, according to the switching signal (square pulse) from the oscillator 470, such that one of the input terminals 410 and 411 of the amplifier 41 is connected to the connection point of the coils 10 and 20, and the other of the input terminals is connected to the connection point of the voltage-dividing resistors R7 and R8. Note that the oscillator 470 is connected to the excitation unit 3, and is configured to acquire the frequency of the excitation signal. The oscillation frequency of the oscillator 470 is set to a frequency 2f that is twice the frequency f of the excitation signal outputted from the excitation unit 3. That is, the oscillator 470 functions as a frequency extraction unit configured to extract a frequency corresponding to twice the frequency of the excitation signal.

The amplifier 41 is constituted by a conventionally known instrumentation amplifier. The amplifier 41 includes, in a front stage thereof, an amplifier circuit to have a differential outputs and formed by two symmetrical operational amplifiers 41A and 41B, and, in a rear stage thereof, a differential amplifier circuit (operational amplifier 41C and resistors R12 to R15) that computes a difference of the outputs of the operational amplifiers 41A and 41B. Note that the output voltage Vo of the amplifier 41 can be obtained by the following Equation (1).

$$Vo = (V1 - V2) \times (1 + (R9 + R11)/R10) \times (R13/R12) \quad (1)$$

where V1 denotes the input voltage of the second input terminal 411 of the amplifier 41, and V2 denotes the input voltage of the first input terminal 410 of the amplifier 41 (refer to FIG. 2).

The output voltage Vo of the amplifier 41 is integrated by the integrator 42 constituted by an operational amplifier 42A, resistors R16 to R18, and a capacitor C1. Note that the resistor R18 is a variable resistor, and is used to adjust an offset voltage.

An input end of the non-inverting amplifier 43 and an input end of the inverting amplifier 44 are connected to an output end of the integrator 42. Also, the detection resistor 46 is connected to the output end of the integrator 42 via the low pass filter 45.

An output end of the non-inverting amplifier 43 is connected to a connection point between the first coil 10 and the excitation unit 3 (current-limiting resistor R2 in the example in FIG. 2) via a resistor R4, and is also connected to a connection point between the second coil 20 and the excitation unit 3 (current-limiting resistor R1 in the example in FIG. 2) via a resistor R3. Also, an output end of the inverting amplifier 44 is connected to a connection point between the first coil 10 and the second coil 20 via a parallel circuit of resistors R5 and R6.

That is to say, in the present embodiment, the output terminals of the non-inverting amplifier 43 and the inverting amplifier 44 are bridge-connected to the first coil 10 and the second coil 20. Note that a configuration in which two amplifiers are bridge-connected to a load is referred to as a bridge-tied load type configuration, and has an advantage that the output voltage can be doubled compared with a case of one amplifier.

Next, operations of the current detecting device of the present embodiment will be described, with reference to FIG. 1.

When an excitation signal is outputted from the excitation unit 3 and is flowed to the first coil 10 and the second coil 20, a magnetic flux (magnetic field) is generated in each of the first core 1 and the second core 2. Note that the second coil 20 is wound in a direction opposite to the first coil 10. Therefore, as shown with arrows in FIG. 1, the direction of the magnetic flux generated in the second core 2 is opposite (reverse) to the direction of the magnetic flux generated in the first core 1.

In the embodiment, the impedance of the first coil 10 and the impedance of the second coil 20 are set to the same value, and the voltage-dividing resistors R7 and R8 have the same resistance value. Accordingly, in the case where current is not flowing in the conductor 100, the output voltage V1 and the output voltage V2 that are detected by the phase detector 40 in synchronization with the excitation signal at a frequency 2f are equal to each other. Specifically, in terms of an average in one period (1/f) of the excitation signal, the output voltage V1 and the output voltage V2 are equal to each other. Therefore, the output of the amplifier 41 will be zero, and the output of the integrator 42 will be zero. Accordingly, a feedback signal that is fed back to the first and second coils 10 and 20 via the non-inverting amplifier 43 and the inverting amplifier 44 will be zero.

Note that, when the excitation signal flows in the first coil 10, an induced electromotive force is generated in the conductor 100 due to the magnetic flux generated in the first core 1. However, at this time, since the excitation signal also flows in the second coil 20, an induced electromotive force is generated in the conductor 100 due to the magnetic flux generated in the second core 2, too. Since the direction of the magnetic flux generated in the second core 2 is opposite to the direction of the magnetic flux generated in the first core 1, the induced electromotive forces generated in the conductor 100 cancel each other out. As a result, noise (noise terminal voltage) that is superimposed in a closed circuit including the conductor 100 is suppressed.

On the other hand, when current flows in the conductor 100, magnetic fluxes (magnetic fields) whose direction is determined according to Ampere's law are generated in the first core 1 and the second core 2 that are disposed on the periphery of the conductor 100 due to the current. Due to the effect of these magnetic fluxes, the magnetic flux that passes through each of the first core 1 and the second core 2 changes. The directions of the magnetic fluxes in the first core 1 and the second core 2 due to the current flowing in the conductor 100 are the same. On the other hand, the directions of the magnetic fluxes in the first core 1 and the second core 2 due to the excitation signal are opposite to each other. Therefore, when current flows in the conductor 100, the impedance of the first coil 10 does not match the impedance of the second coil 20. On the other hand, the resistances of the voltage-dividing resistors R7 and R8 do not change. As a result, a difference is generated between the output voltages V1 and V2 in the phase detector 40 in proportion to the current flowing in the conductor 100. Accordingly, the output of the integrator 42 takes a value (voltage level) corresponding to the magnitude of the current flowing in the conductor 100.

The output of the integrator 42 is amplified by the non-inverting amplifier 43 and the inverting amplifier 44, and the amplified signals are fed back to the first coil 10 and the second coil 20. Here, the output (feedback signal) of the integrator 42 is set such that negative feedback is applied (that is, the change-over switches 400 and 401 of the phase detector 40 are switched such that the output of the integrator 42 has a polarity for applying negative feedback). Accordingly, due to the feedback signal being superimposed on the excitation signal, the change in each of the magnetic fluxes passing through the first core 1 and the second core 2 is cancelled out (the magnetic flux due to the current flowing in the conductor 100 is cancelled out by the magnetic flux due to the feedback signal). Therefore, by detecting the level of the output (feedback signal) of the integrator 42 when the change in the magnetic flux passing through the first core 1 (magnetic flux due to the current flowing in the conductor 100) is regarded as zero, by measuring the voltage (voltage drop) Vs across the detection resistor 46, the magnitude of the current flowing in the conductor 100 can be calculated from the level of the detected feedback signal. Note that the detection resistor 46 is sufficient to be able to detect the level of the feedback signal, and may be interposed in a path where the feedback signal flows from the integrator 42 to the first coil 10, as shown in FIG. 1, or provided between the integrator 42 and ground, as shown in FIG. 2. In the configuration shown in FIG. 2, harmonic noise is removed by filtering the output of the integrator 42 with the low pass filter 45, and as a result detection accuracy can be improved.

Here, since the excitation signal on which the feedback signal is superimposed also flows in the second coil 20, the induced electromotive force induced in the conductor 100 due to the magnetic flux generated in the first core 1 and the induced electromotive force induced in the conductor 100 due to the magnetic flux generated in the second core 2 cancel each other out. As a result, noise that is superimposed in the closed circuit including the conductor 100 is suppressed.

In the present embodiment, as described above, since the first core 1 and the second core 2 that generates a magnetic flux having a direction opposite to the magnetic flux generated in the first core 1 are disposed in the vicinity of the conductor 100, noise that is superimposed in the closed circuit including the conductor 100 can be suppressed.

Figure 4A:
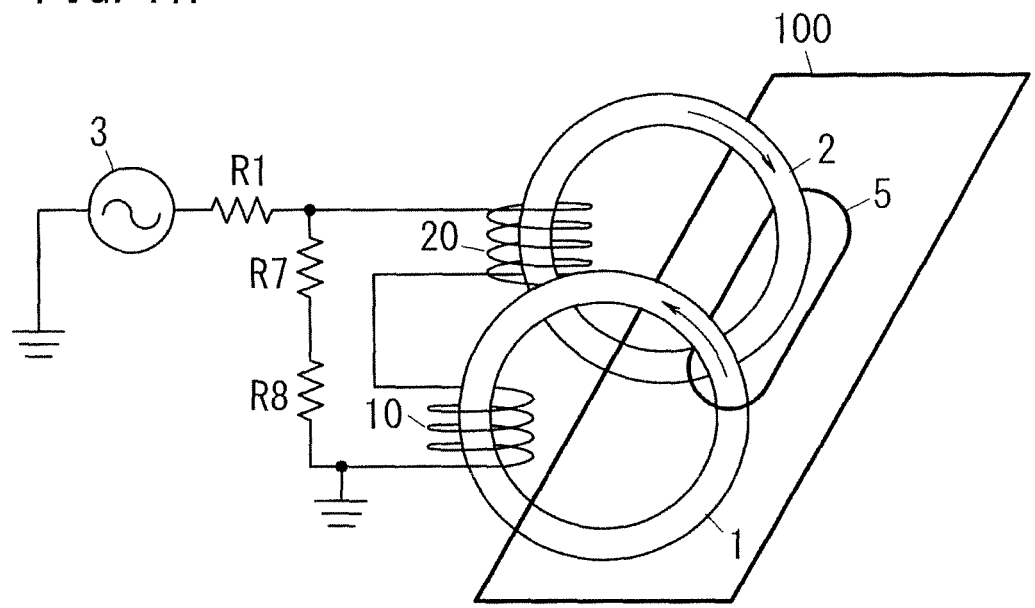
FIGS. 4A and 4B are block diagrams illustrating variations of Embodiment 1 in which a portion thereof has been omitted.

Also, as shown in FIG. 4A, a third coil 5 may be wound around both the first core 1 and second core 2 to form a closed circuit. According to this configuration, a turn ratio is increased compared with a case where the third coil 5 is not provided, the turn ratio being a ratio of "the number of turns of the closed circuit including the conductor 100 and the third coil 5" relative to "the number of turns of the first coil 10 (second coil 20)". The number of turns of the first coil 10, the number of turns of the second coil 20, and the magnitude of the excitation current (excitation signal) are fixed, and the increase in the turn ratio causes current flowing in the closed circuit including the conductor 100 to decrease, and noise (noise terminal voltage) to be suppressed.

Figure 4B:
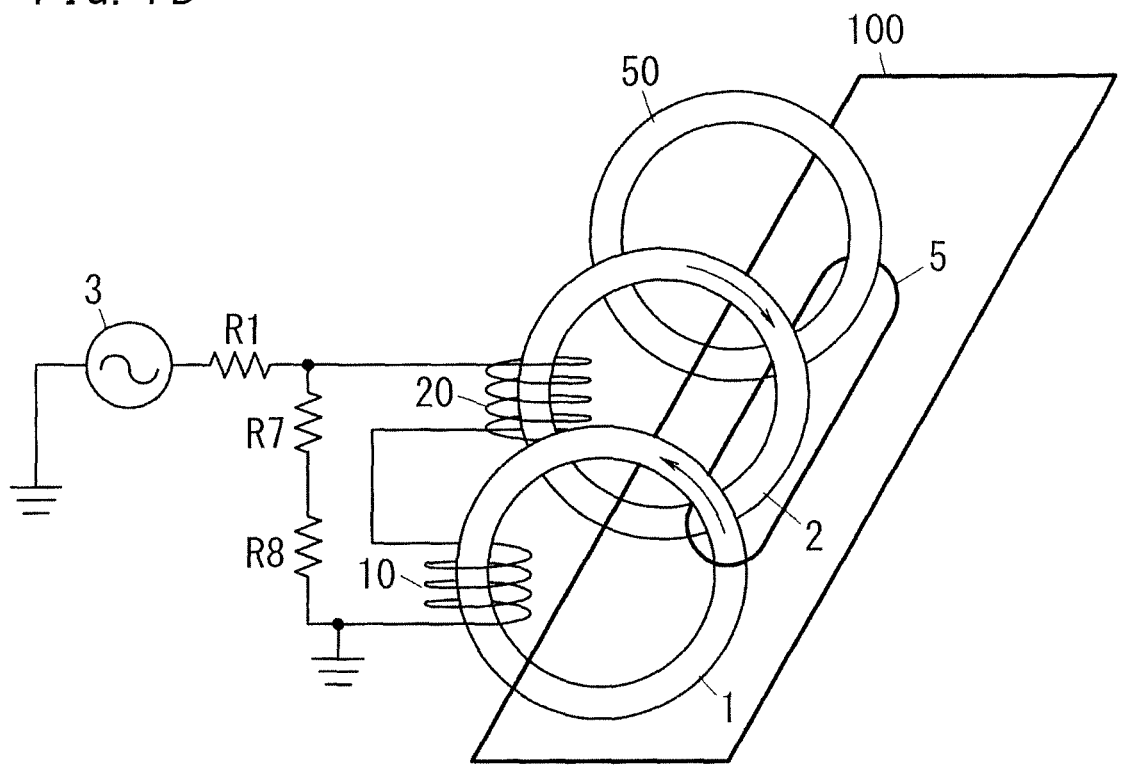

Furthermore, as shown in FIG. 4B, a third core 50 may be provided, and both the conductor 100 and the third coil 5 may be wound around the third core 50. Specifically, each the conductor 100 and the third coil 5 is wound around the first core 1, the second core 2, and the third core 50. By providing the third core 50, magnetic resistance is reduced and the current necessary for generating the magnetic flux decreases, and as a result noise can be further suppressed. Note that, FIGS. 4A and 4B illustrates a case where the first coil 10 and the second coil 20 are connected in series, but similar effect can be obtained also in a case where the first coil 10 and the second coil 20 are connected in parallel, by adding the third coil 5 and the third core 50.

Figure 5:
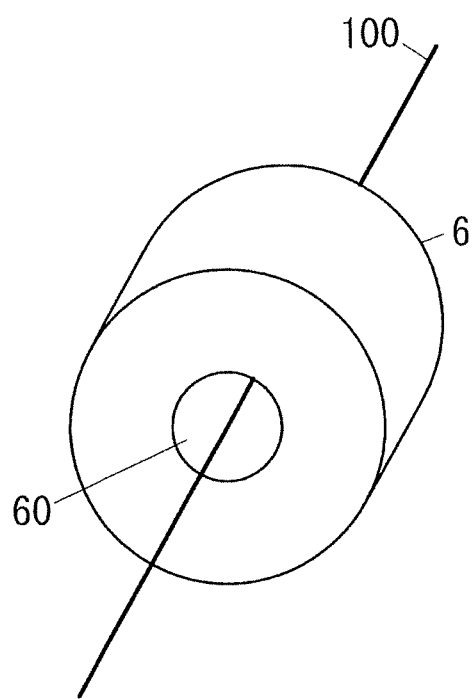
FIG. 5 is a perspective view illustrating a variation of Embodiment 1 in which a portion thereof has been omitted.

Also, as shown in FIG. 5, the first core 1 and the second core 2 may be housed in a shield case 6 made of a magnetic material together with the first coil 10 and the second coil 20. The shield case 6 is formed in a cylindrical shape having a through hole 60 in a center thereof. The conductor 100 is inserted into the through hole 60 of the shield case 6. By housing the first core 1 and the second core 2 inside the shield case 6 together with the first coil 10 and the second coil 20, as described above, noise immunity with respect to external electromagnetic wave noise can be improved.

Figure 6A:
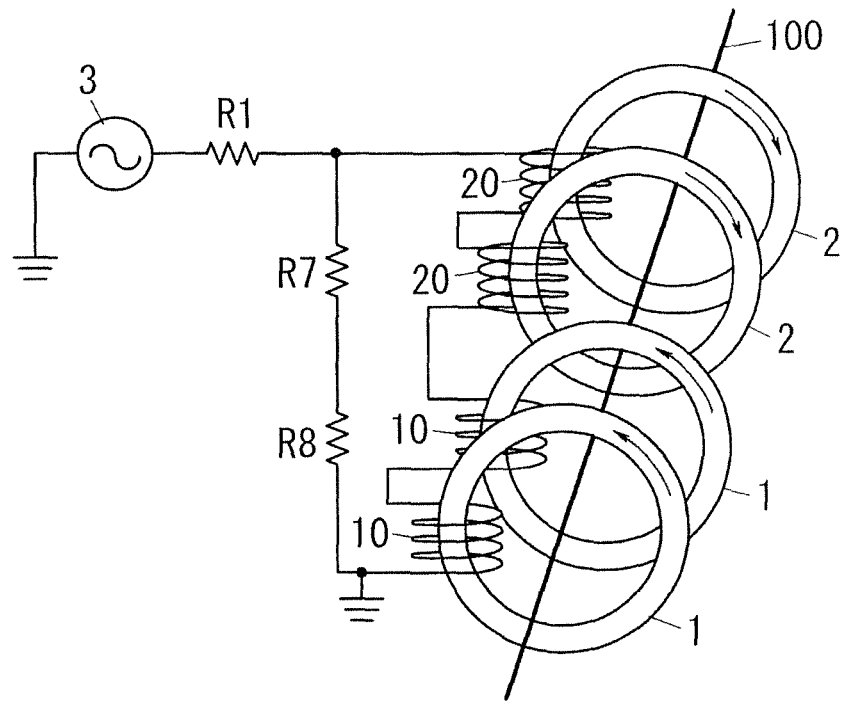
FIGS. 6A and 6B are block diagrams illustrating variations of Embodiment 1 in which a portion thereof has been omitted.
Figure 6B:
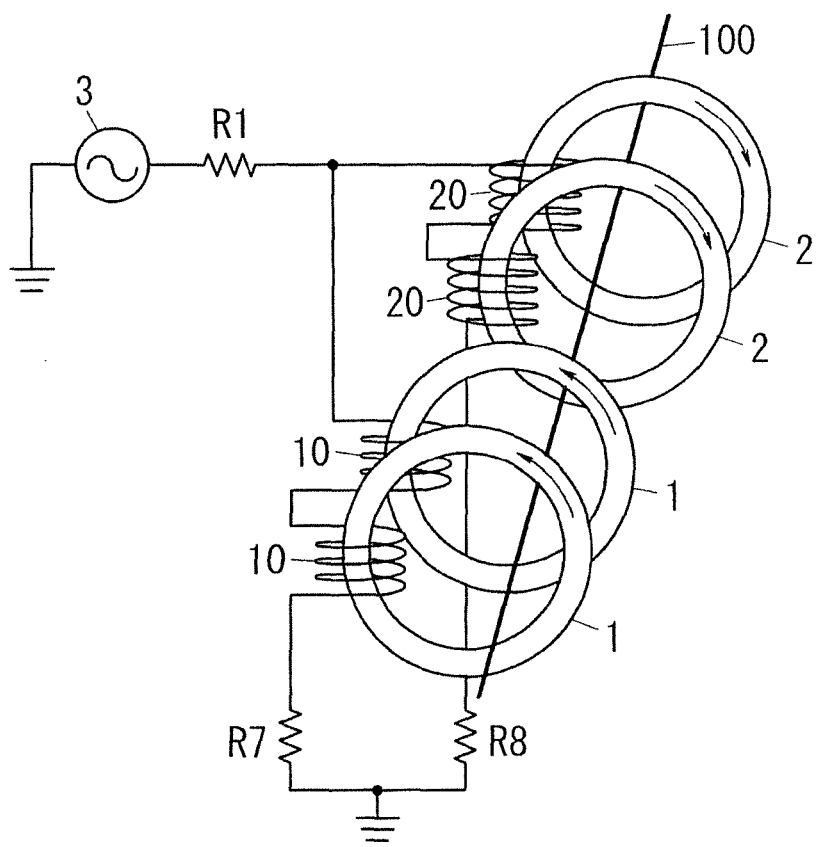

Also, as shown in FIGS. 6A and 6B, it is possible that the device includes two or more first cores 1 around each of which the first coil 10 is wound, and two or more second cores 2 around each of which the second coil 20 is wound. FIG. 6A shows a case where a series circuit of the first coils 10 and a series circuit of the second coils 20 are connected in series. FIG. GB shows a case where the series circuit of the first coils 10 and the series circuit of the second coils 20 are connected in parallel. According to such configurations, fluctuations in magnetic characteristics and electric characteristics of the first core 1 around which the first coil 10 is wound and the second core 2 around which the second coil 20 is wound can be reduced, and noise can be suppressed.

Figure 7:
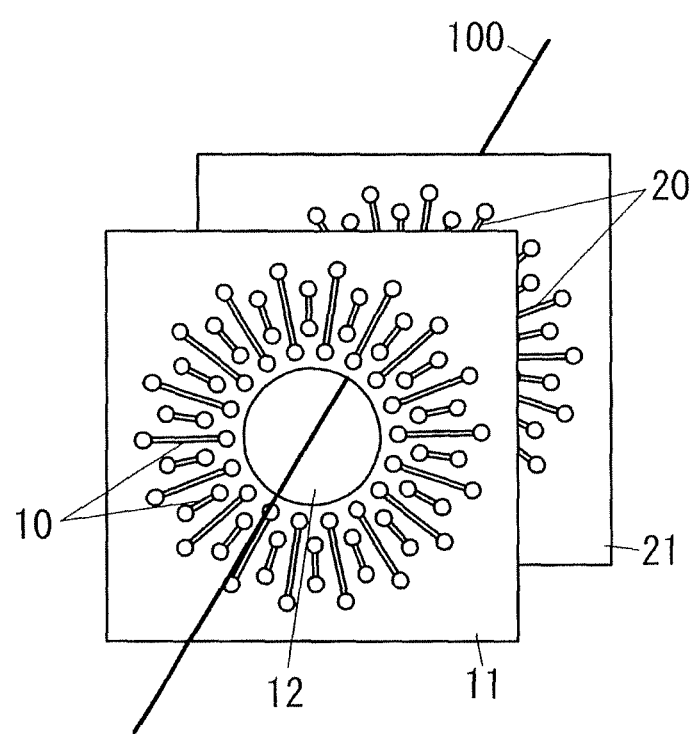
FIG. 7 is a block diagram illustrating a variation of Embodiment 1 in which a portion thereof has been omitted.

Incidentally, as shown in FIG. 7, the first and second coils 10 and 20 may be configured by respective conductor patterns formed on surfaces of substrates 11 and 21 made of an insulating material. In this case, the first and second cores (not shown) can be formed of magnetic bodies into a ring-like shape by being insert-molded to the substrates 11 and 21. Note that the conductor 100 is inserted into through holes 12 and 22 that respectively pass through the substrates 11 and 21 at the center. Also, portion of the conductor pattern (portion exposed from the through hole 12) on the substrate 21 is not illustrated in FIG. 7.

Figure 8A:
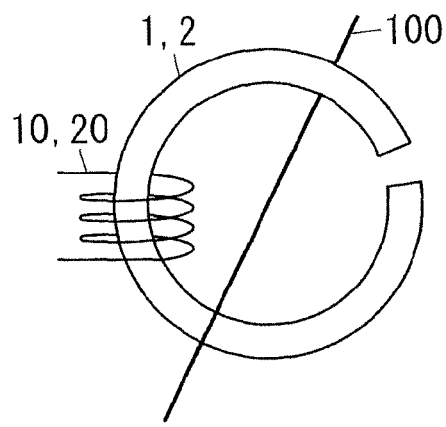
FIGS. 8A to 8D illustrate variations of a first and a second core in Embodiment 1, FIG. 8A being a perspective view and FIGS. 8B to 8D being diagrams describing a manufacturing method.
Figure 8B:
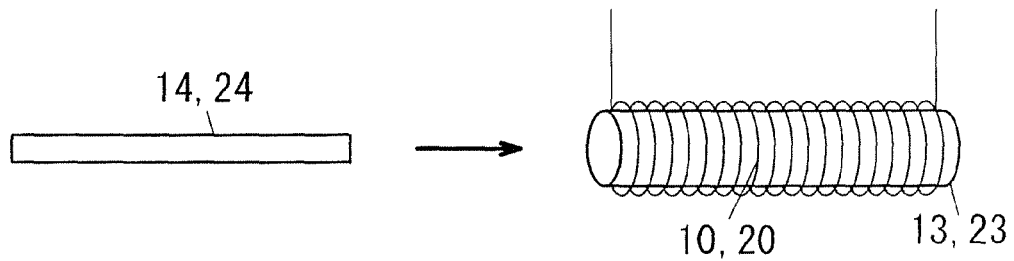
Figure 8C:
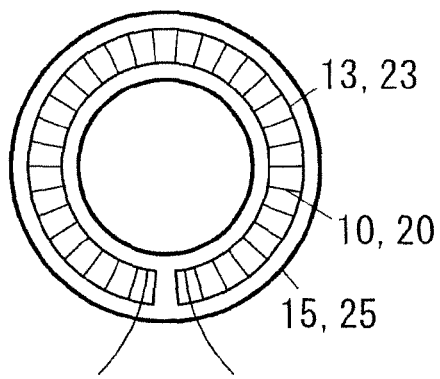
Figure 8D:
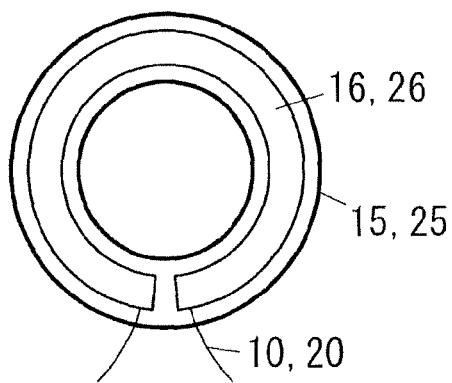

Also, the first and second cores 1 and 2 may be formed in a partially opened approximate C-shape (incomplete ring shape) as shown in FIG. 8A. For example, as shown in FIG. 8B, a coil 10 (20) is wound around a cylindrical bobbin 13 (23), and a magnetic body 14 (24) shaped like a bar is inserted inside the bobbin 13 (23). Then, as shown in FIG. 8C, the bobbin 13 (23) into which the magnetic body 14 (24) is inserted is housed inside a ring-like casing 15 (25). Finally, as shown in FIG. 8D, by covering the bobbin 13 (23) with a shield plate 16 (26) made of a magnetic material, the approximately C-shaped first core 1 (second core 2) can be formed. By adopting such a manufacturing method, the first core 1 around which the first coil 10 is wound and the second coil 20 around which the second core 2 is wound can be easily manufactured.

Incidentally, when the excitation signal changes sharply, induced electromotive force induced in the conductor 100 increases, and noise (noise terminal voltage) also increases. Accordingly, a signal that does not change sharply such as a sine wave signal is preferable as the excitation signal rather than a signal that changes sharply such as a square wave signal. On the other hand, the square wave signal has an advantage over the sine wave signal in that the circuit configuration of the excitation unit 3 can be simplified.

Figure 9A:
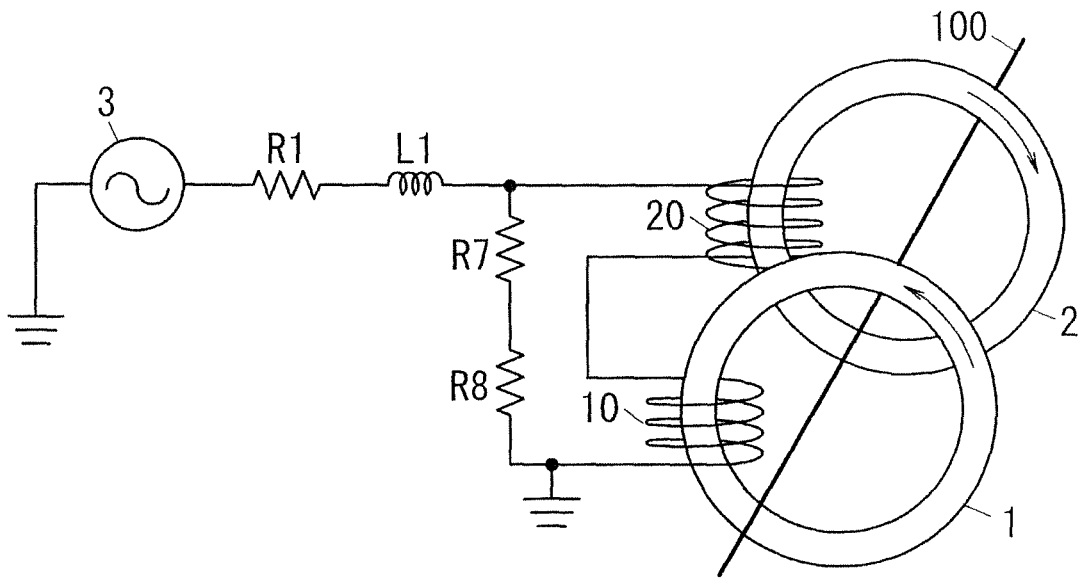
FIGS. 9A and 9B are block diagrams illustrating variations of Embodiment 1 in which a portion thereof has been omitted.
Figure 9B:
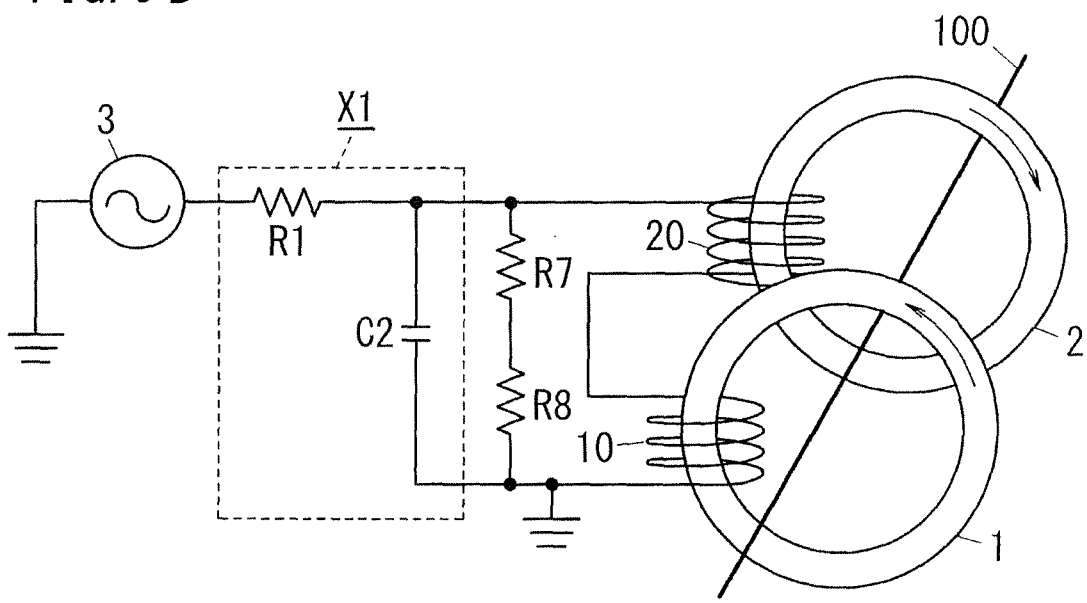

Accordingly, it is preferable that the excitation unit 3 is configured to output the excitation signal having a square wave, and an impedance element (inductor L1, for example) is interposed in a path in which the excitation signal flows from the excitation unit 3 to the first coil 10 and the second coil 20 (refer to FIG. 9A). Alternatively, a low pass filter X1 may be interposed instead of the impedance element (refer to FIG. 9B). Note that the low pass filter X1 is configured by an integration circuit constituted by a resistor R1 and a capacitor C2. By providing the inductor L1 or the low pass filter X1 in this way, the excitation signal can be rounded to reduce the sharp change. As a result, noise (noise terminal voltage) superimposed in a closed circuit including the conductor 100 can be suppressed.

Embodiment 2

The present embodiment has a basic configuration in common with Embodiment 1, and a detection method of current flowing in the conductor 100 is different from that of Embodiment 1. Accordingly, constituent elements in common with Embodiment 1 are provided with the same reference numerals, and illustration and description thereof will be omitted as appropriate.

Figure 10A:
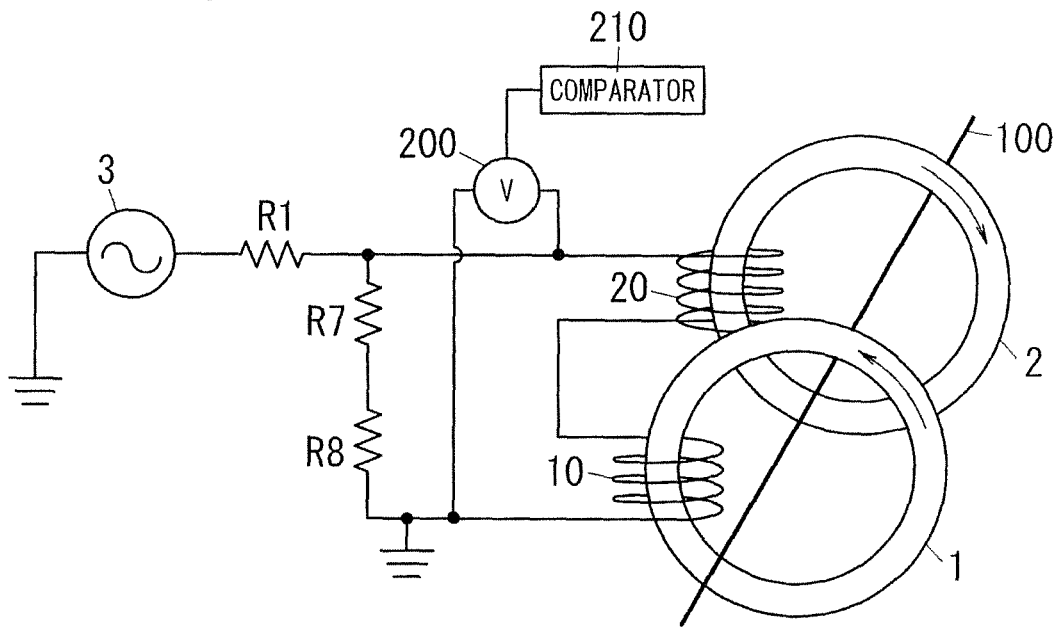
FIGS. 10A and 10B are block diagrams illustrating Embodiment 2 of the current detecting device according to the present invention in which a portion thereof has been omitted.

When an over-current flows in the conductor 100, magnetic fluxes passing through first and second cores 1 and 2 increase and exceed a maximum magnetic flux density (saturation magnetic flux density), and as a result the first and second cores 1 and 2 magnetically saturate. When the first and second cores 1 and 2 magnetically saturate, the impedances of the first and second coils 10 and 20 decrease, and, if the current of the excitation signal is fixed, the voltage across the first and second coils 10 and 20 (signal voltage) decreases. Therefore, by causing the excitation unit 3 to output the excitation signal having a fixed current, and measuring the signal voltage across the first and second coils 10 and 20 with a signal voltage measurement unit 200 as shown in FIG. 10A, the magnitude of the over-current flowing in the conductor 100 can be measured.

Figure 10B:
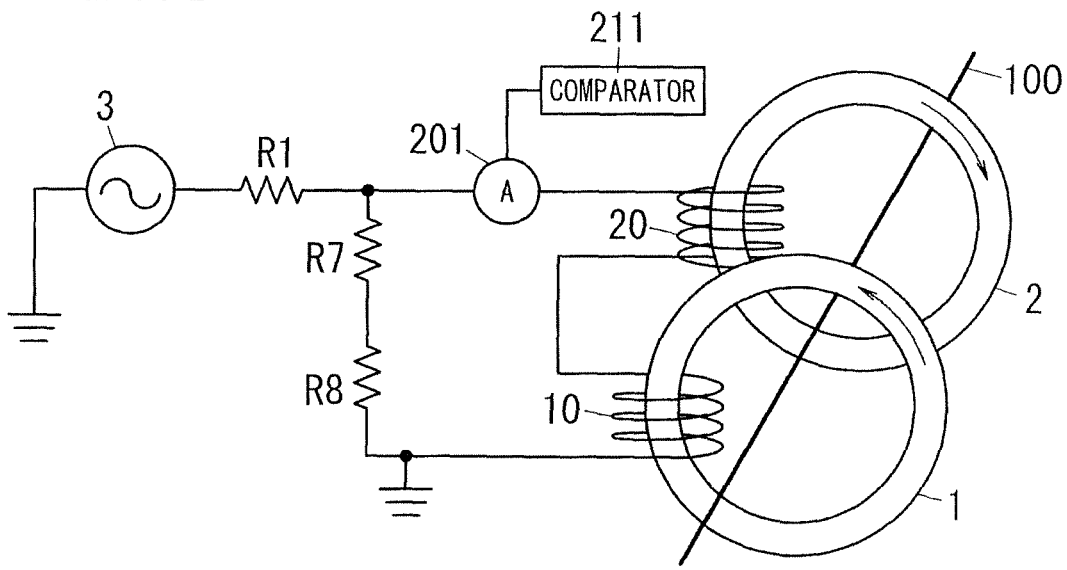

Alternatively, if the voltage of the excitation signal is fixed, the current (excitation signal) flowing in the first and second coils 10 and 20 increases when the impedances of the first and second coils 10 and 20 decrease. Therefore, by causing the excitation unit 3 to output the excitation signal having a fixed voltage, and measuring a signal current flowing in the first and second coils 10 and 20 with a signal current measurement unit 201 as shown in FIG. 10B, the magnitude of the over current flowing in the conductor 100 can be measured.

As a variation, a comparator (comparison unit) 210 or 211 may be provided for comparing a measured value of the signal voltage measurement unit 200 or a measured value of the signal current measurement unit 201 with a predetermined threshold value. That is, the threshold value is set to such a value that the measured value exceeds the threshold value upon the current flowing in the conductor 100 exceeding a predetermined level. Accordingly, flow of an over current exceeding the predetermined level in the conductor 100 can be detected from the output of the comparator 210 or 211.

Embodiment 3

The present embodiment has a basic configuration in common with Embodiment 1, and therefore constituent elements in common with Embodiment 1 are provided with the same reference numerals, and illustration and description thereof will be omitted as appropriate.

Figure 11:
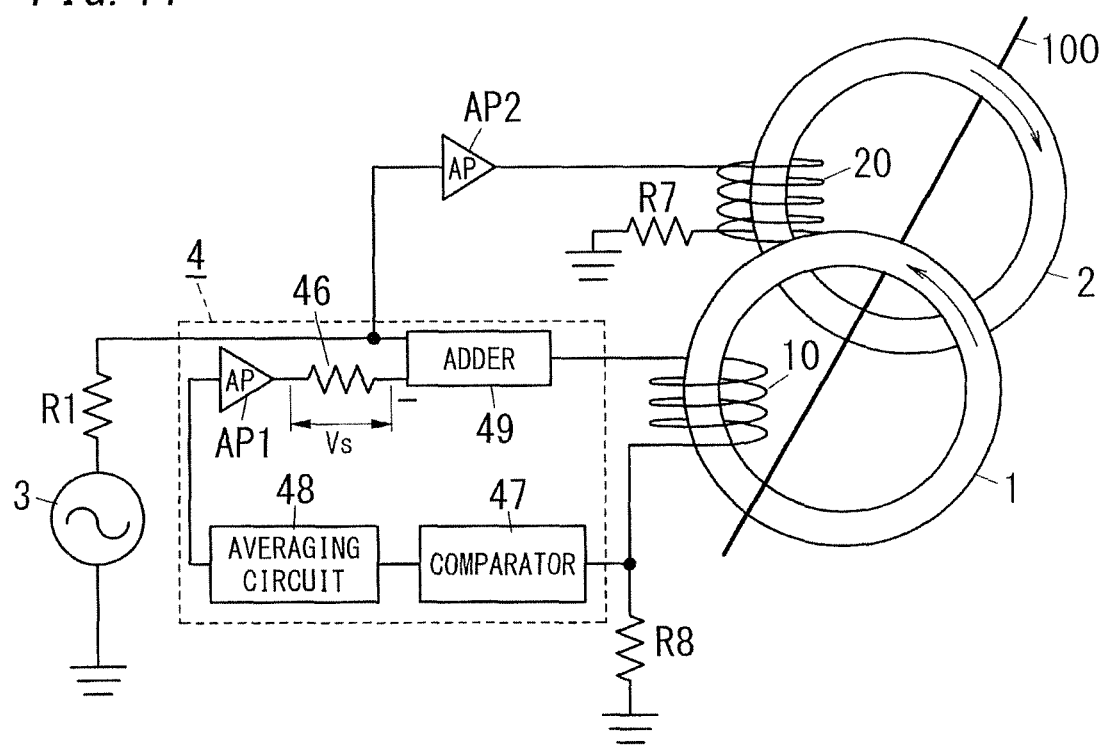
FIG. 11 is a block diagram illustrating Embodiment 3 of the current detecting device according to the present invention.

The present embodiment differs from Embodiment 1 in terms of the configuration of the feedback unit 4, as shown in FIG. 11. The feedback unit 4 in the present embodiment includes a comparator 47, an averaging circuit 48, an amplifier AP1, an adder 49, and the like.

In the present embodiment, a positive terminal of an excitation unit 3 is connected to one input end of the adder 49 via a current-limiting resistor R1, and an excitation signal from the excitation unit 3 is inputted to this one input end.

The comparator 47 is a so-called window comparator, and is configured to compare threshold values that have the same absolute value and different signs with the excitation signal (a voltage drop across the resistor R8 that is proportional to the excitation signal, in actuality). The averaging circuit 48 is configured to calculate a time average of the output of the comparator 47 over the period of the excitation signal, and is constituted by an integration circuit, for example. The output from the averaging circuit 48 is amplified by the amplifier AP1, and then is inputted to the other input end of the adder 49 via a detection resistor 46.

The adder 49 is constituted by an inverting amplifier that includes an operational amplifier, a feedback resistor, and an input resistor, and is configured to add an output of the averaging circuit 48 inputted via the detection resistor 46 to the excitation signal outputted from the excitation unit 3, and output the addition result to the first coil 10. Note that the excitation signal is applied to the second coil 20 via an amplifier AP2.

Next, operations of the current detecting device of the present embodiment will be described.

When the excitation signal (excitation current) flows in the first coil 10, a magnetic flux (magnetic field) is generated in a first core 1. The direction and magnitude of the magnetic flux change in synchronization with the excitation signal. That is, in the case where current is not flowing in the conductor 100, the magnetic flux due to the excitation signal flowing in the first coil 10 is the only magnetic flux in the first core 1, and therefore the magnetization characteristic (B-H characteristic) of the first core 1 will be a loop that is point symmetrical about the origin, as shown by the solid line in FIG. 12A.

Here, the present embodiment adopts a flux gate magnetic flux detection method, and is configured such that, the first core 1 is magnetically saturated, causing the excitation signal (excitation current) to change rapidly, and the comparator 47 detects the timing at which the excitation current changes rapidly (refer to the solid line in FIG. 12B). In the case where no current flows in the conductor 100, the period during which the output of the comparator 47 is a high level and the period during which the output of the comparator 47 is a low level are both T/2, with respect to the period T of the excitation signal. Accordingly, the output of the averaging circuit 48 is zero, and nothing is added to the excitation signal.

On the other hand, when current flows in the conductor 100, a magnetic flux (magnetic field) is generated in the first core 1 that is disposed on the periphery of the conductor 100, the direction of the magnetic flux being determined according to Ampere's law. Accordingly, the magnetization characteristic of the first core 1 changes, and will not be a loop that is point symmetrical about the origin, as shown by the broken line in FIG. 12A. Therefore, a time period difference occurs between the period during which the output of the comparator 47 is a high level and the period during which the output thereof is a low level. For example, the period during which the output of the comparator 47 is a high level is $T/2+\Delta T$ and the period during which the output thereof is a low level is $T/2-\Delta T$ (refer to FIG. 12C). As a result, the output of the averaging circuit 48 is non-zero, and takes a level according to the time difference ($2\Delta T$) (refer to FIG. 12D).

The output of the averaging circuit 48 is amplified in the amplifier AP1 and then added, in the adder 49, to the excitation signal that is outputted from the excitation unit 3. In the embodiment, the adder 49 is configured to invert the output of the averaging circuit 48, and to add the inverted output to the excitation signal that is outputted from the excitation unit 3. That is, as a result of the output of the averaging circuit 48 being added to the excitation signal, feedback (negative feedback) for making the time difference $\Delta T$ zero is applied. Accordingly, by detecting the level of the output (feedback signal) of the averaging circuit 48 when the time difference $\Delta T$ is regarded as zero, by measuring a voltage (voltage drop) Vs across the detection resistor 46, the magnitude of the current flowing in the conductor 100 can be calculated from the detected feedback signal level. Note that in a configuration that threshold value of the comparator 47 is variable, the sensitivity of current detection can be adjusted.

Also, in the present embodiment, similarly to Embodiment 1, since the second core 2 that generates a magnetic flux having a direction opposite to the magnetic flux generated in the first core 1 is disposed in the vicinity of the conductor 100 along with the first core 1, noise that is superimposed in a closed circuit including the conductor 100 can be suppressed.

Incidentally, the feedback unit 4 may include only the averaging circuit 48 configured to calculate a time average of the excitation signal over the period of the excitation signal instead of including the comparator 47 and the averaging circuit 48, and be configured to generate the feedback signal from the output of the averaging circuit 48.

Alternatively, the feedback unit 4 may include an effective value calculation circuit (not shown) configured to calculate an effective value of the excitation signal instead of including the comparator 47 and the averaging circuit 48, and be configured to generate the feedback signal from the effective value calculated in the effective value calculation circuit.

Figure 13:
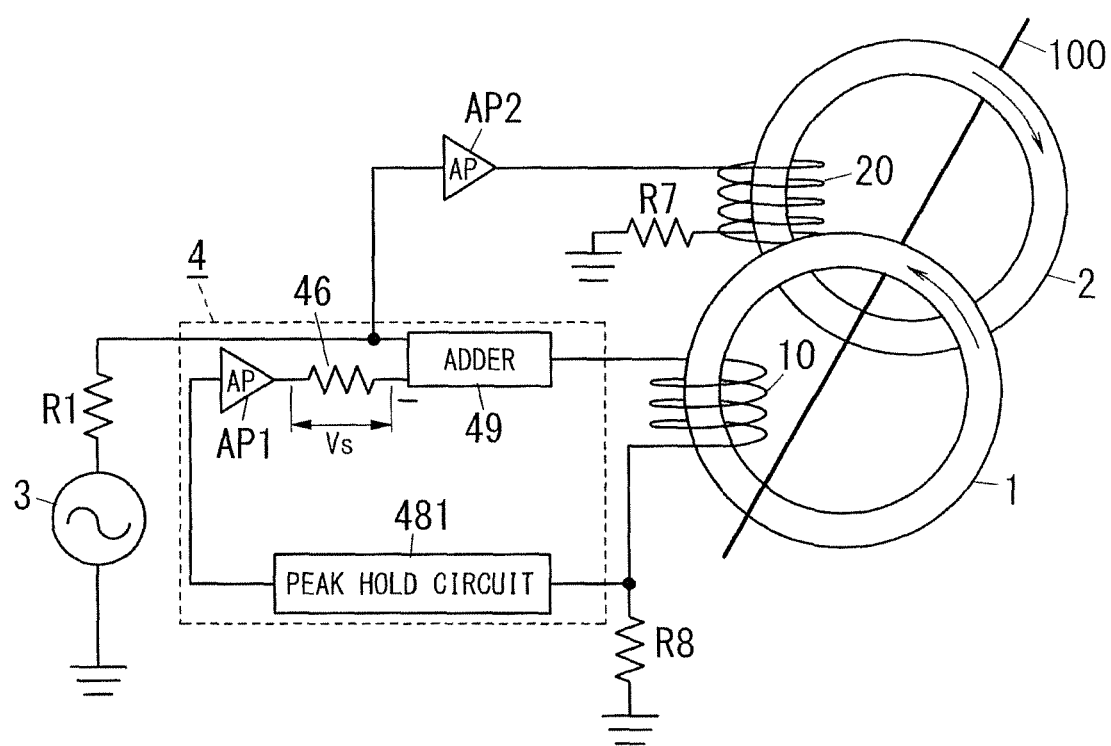
FIG. 13 is a block diagram illustrating a variation of Embodiment 3.

Also, as shown in FIG. 13, the feedback unit 4 may include a peak hold circuit (peak hold unit) 481 configured to hold a positive peak value and a negative peak value of the excitation signal instead of including the comparator 47 and the averaging circuit 48. In this case, the feedback unit 4 is configured to generate a feedback signal by using both the positive and negative peak values held in the peak hold circuit 481, and output the obtained feedback signal to the adder 49.

Note that the effective value calculation circuit and the peak hold circuit 481 can be realized by a known technique, and detailed illustration and description of the circuit configuration are omitted.

Embodiment 4

Figure 14A:
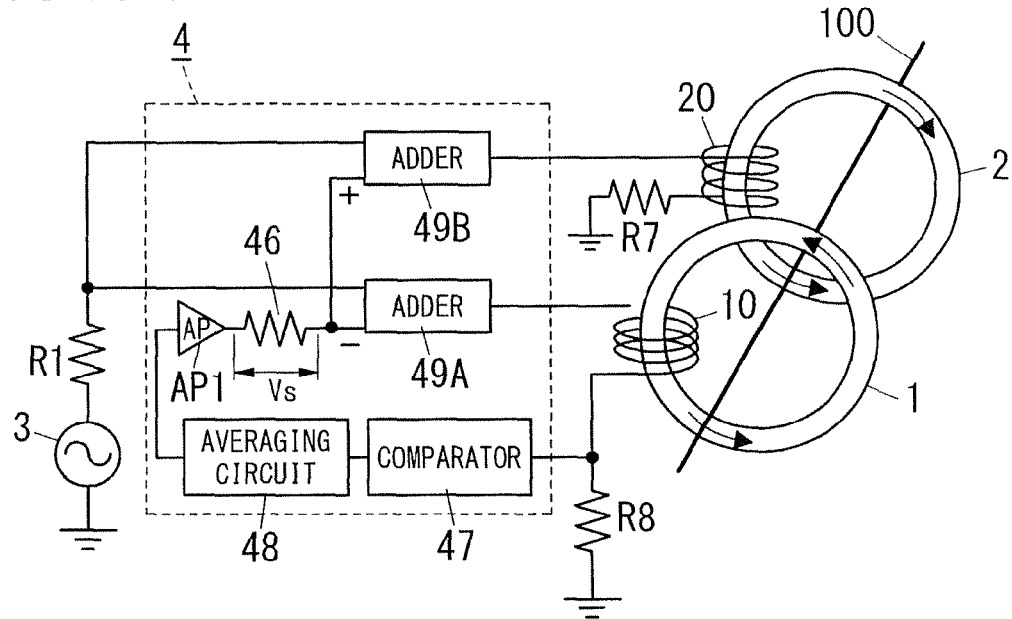
FIGS. 14A and 14B illustrate Embodiment 4 of the current detecting device according to the present invention, FIG. 14A being a block diagram and FIG. 14B being circuit configuration diagrams.

A current detecting device of the present embodiment is characterized in that a feedback unit 4 includes two adders 49A and 49B, as shown in FIG. 14A, and the remaining configuration is in common with Embodiment 3. Therefore, constituent elements in common with Embodiment 3 are provided with the same reference numerals, and illustration and description thereof will be omitted as appropriate.

One adder (first adder) 49A is configured to add a feedback signal (signal for cancelling out the magnetic flux generated in a first core 1 due to current flowing in a conductor 100) to an excitation signal from an excitation unit 3, and output the resultant signal to a first coil 10.

The other adder (second adder) 49B is configured to add a signal, which is a signal generated by inverting the feedback signal, to the excitation signal from the excitation unit 3, and output the resultant signal to a second coil 20.

Figure 14B:
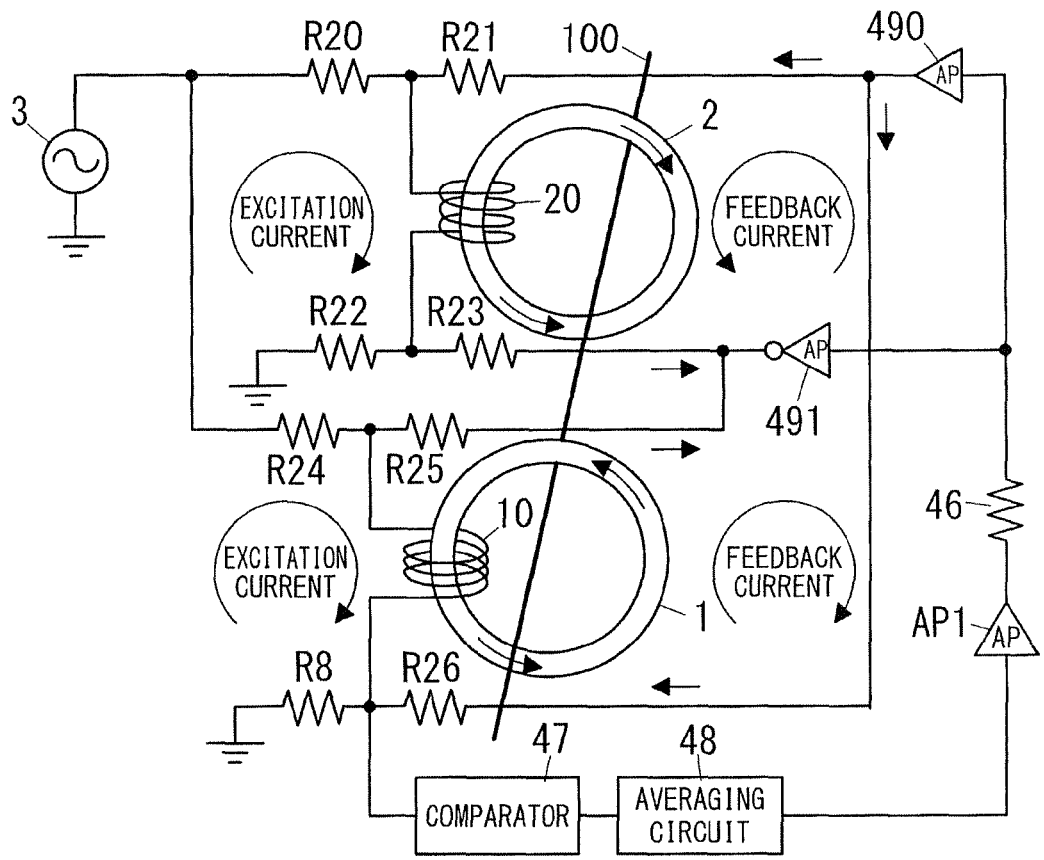
Figure 15A:
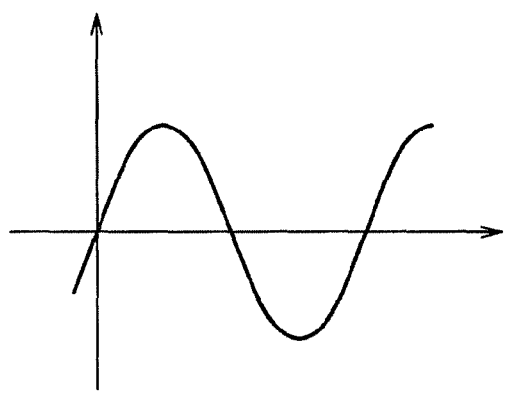
FIGS. 15A to 15D are waveform diagrams illustrating examples of an excitation signal in Embodiment 1.
Figure 15B:
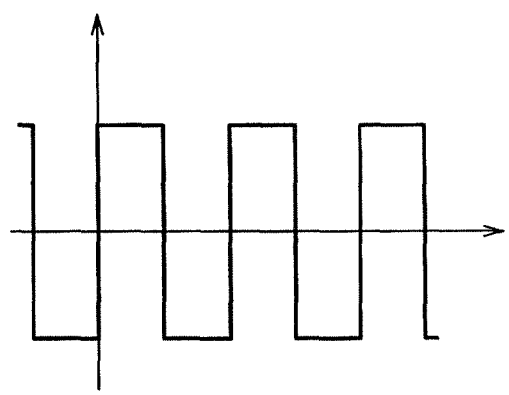
Figure 15C:
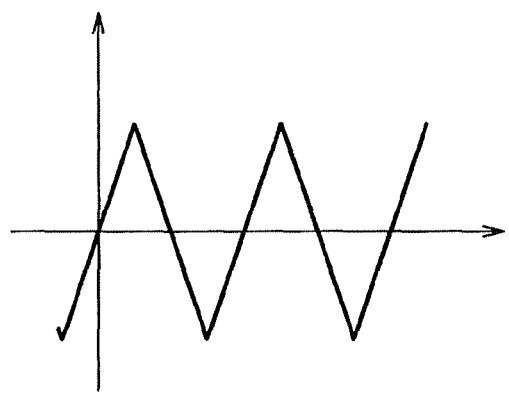
Figure 15D:
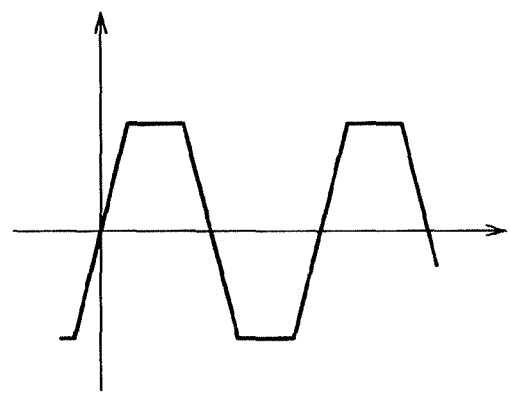

For example, the first adder 49A includes an inverting amplifier 491 and resistors R24 and R25, as shown in FIG. 14B. Also, the second adder 49B includes a non-inverting amplifier 490 and resistors R20 and R21, as shown in FIG. 14B. The inverting amplifier 491 is configured to invert the output from the amplifier AP1 to generate the feedback signal. Also, the non-inverting amplifier 490 is configured to generate "a signal generated by inverting the feedback signal".

An input end of the non-inverting amplifier 490 is connected to an output end of an averaging circuit 48 via a detection resistor 46 and the amplifier AP1, and an output end thereof is connected to a positive terminal of the excitation unit 3 via a series circuit of the resistors R20 and R21. The output end of the non-inverting amplifier 490 is also connected to ground via a series circuit of resistors R8 and R26. An input end of the inverting amplifier 491 is connected to the output end of the averaging circuit 48 via the detection resistor 46 and the amplifier AP1, and an output end thereof is connected to the positive terminal of the excitation unit 3 via a series circuit of the resistors R24 and R25. The output end of the inverting amplifier 491 is also connected to ground via a series circuit of resistors R22 and R23.

One end of the first coil 10 is connected to a connection point between the resistors R24 and R25 (connection point between the excitation unit 3 and the output terminal of the inverting amplifier 491), and the other end thereof is connected to a connection point between the resistors R8 and R26 (connection point between ground and the output terminal of the non-inverting amplifier 490). One end of the second coil 20 is connected to a connection point between the resistors R20 and R21 (connection point between the excitation unit 3 and the output terminal of the non-inverting amplifier 490), and the other end thereof is connected to a connection point between the resistors R22 and R23 (connection point between ground and the output terminal of the inverting amplifier 491). That is, in the example shown in FIG. 14B, the output terminal of the inverting amplifier 491 and the output terminal of the non-inverting amplifier 490 are bridge-connected to the first coil 10 and the second coil 20.

The current detecting device of the present embodiment is configured as described above, and the basic operations are in common with Embodiment 3. Note that, whereas only the excitation signal is caused to flow in the second coil 20 in Embodiment 3, the feedback unit 4 in the present embodiment adds the feedback signal to the excitation signal and causes the resultant signal to also flow to the second coil 20, similarly to the first coil 10. Note that a signal resulting from adding a signal generated by inverting the feedback signal to the excitation signal is caused to flow to the second coil 20 from the second adder 49B.

In the current detecting device of the present embodiment, a magnetic flux having a direction opposite to the magnetic flux generated in the first core 1 is generated in the second core 2, and accordingly noise generated when current flows in the conductor 100 can further be suppressed, compared with Embodiment 3.

The invention claimed is:

1. A current detecting device comprising:
   a first core around which a single first coil is wound, the first core disposed in a vicinity of a conductor which is a detection target;
   a second core around which a single second coil is wound, the second core disposed in a vicinity of the conductor;
   an excitation unit configured to apply an excitation signal, having a magnitude and a direction that change at a given frequency, to the first coil and the second coil; and
   a feedback unit configured to feedback a feedback signal to the excitation signal such that a magnetic flux generated in the first core due to current flowing in the conductor is cancelled out,
   the second coil being configured to generate a magnetic flux having a direction opposite to a magnetic flux generated by the excitation signal flowing in the first coil.

2. The current detecting device according to claim 1, wherein the first coil and the second coil are connected in series to the excitation unit.

3. The current detecting device according to claim 1, wherein the first coil and the second coil are connected in parallel to the excitation unit.

4. The current detecting device according to claim 1, further comprising a third coil that is wound around both the first core and the second core, and forms a closed circuit.

5. The current detecting device according to claim 4, further comprising a third core to be disposed in a vicinity of the conductor,
   wherein the third coil is also wound around the third core.

6. The current detecting device according to claim 1, further comprising a shield case made of magnetic material and housing the first core and the second core along with the first coil and the second coil.

7. The current detecting device according to claim 1, wherein an impedance element or a low pass filter is located in a path in which the excitation signal flows from the excitation unit to the first coil and the second coil.

8. The current detecting device according to claim 1, wherein the excitation unit is configured to shape a signal waveform of the excitation signal to a sine wave, a triangular wave, or a trapezoidal wave.

9. The current detecting device according to claim 1, wherein the excitation unit is configured to shape a signal waveform of the excitation signal to a square wave.

10. The current detecting device according to claim 1, further comprising a signal voltage measurement unit configured to measure a signal voltage of the excitation signal that is applied to the first coil and the second coil.

11. The current detecting device according to claim 10, further comprising a comparison unit configured to compare a measured value of the signal voltage with a predetermined threshold value.

12. The current detecting device according to claim 1, further comprising a signal current measurement unit configured to measure a signal current of the excitation signal that flows in the first coil and the second coil.

13. The current detecting device according to claim 12, further comprising a comparison unit configured to compare a measured value of the signal current with a predetermined threshold value.

14. The current detecting device according to claim 1, further comprising a frequency extraction unit configured to extract a frequency corresponding to twice the given frequency from the excitation signal,
    wherein the feedback unit is configured to generate the feedback signal based on the frequency extracted by the frequency extraction unit.

15. The current detecting device according to claim 14,
    wherein the feedback unit comprises a non-inverting amplifier configured to perform non-inverting amplification on the feedback signal, and an inverting amplifier configured to perform inverting amplification on the feedback signal, and
    wherein output terminals of the non-inverting amplifier and the inverting amplifier are bridge-connected to the first coil and the second coil.

16. The current detecting device according to claim 14, wherein the feedback unit comprises a first adder configured to add the feedback signal to the excitation signal and cause the added signal to flow to the first coil, and a second adder configured to add a signal generated by inverting the feedback signal to the excitation signal and cause the added signal to flow to the second coil.

17. The current detecting device according to claim 1,
    wherein the feedback unit is configured to output the excitation signal having a waveform which is symmetric in positive and negative,
    wherein the current detecting device further comprises a peak hold unit configured to hold positive and negative peak values of the excitation signal, and
    wherein the feedback unit is configured to generate the feedback signal from the positive and negative peak values that are held in the peak hold unit.

18. The current detecting device according to claim 1, wherein the feedback unit comprises a comparator configured to compare the excitation signal with threshold values that have the same absolute value and different signs, and is configured to generate the feedback signal from an output of the comparator.

19. The current detecting device according to claim 1, further comprising a detection resistor for detecting a signal voltage of the feedback signal, and a low pass filter provided upstream of the detection resistor.

\* \* \* \* \*